United States Patent [19]

Suzuki et al.

[11] Patent Number: 4,754,117

[45] Date of Patent: Jun. 28, 1988

[54] ANNEALING METHOD BY IRRADIATION OF LIGHT BEAMS

[75] Inventors: Toshiharu Suzuki, Kanagawa; Jiro Kasahara, Tokyo; Michio Arai, Kanagawa, all of Japan

[73] Assignee: Sony Corporation, Tokyo, Japan

[21] Appl. No.: 843,979

[22] Filed: Mar. 25, 1986

[30] Foreign Application Priority Data

Mar. 25, 1985 [JP] Japan .................................. 60-60249

[51] Int. Cl.$^4$ ............................................ B23K 26/00
[52] U.S. Cl. ...................... 219/121 LM; 219/121 LB; 219/121 LZ
[58] Field of Search .... 219/121 L, 121 LM, 121 LA, 219/121 LB, 121 LZ; 148/1.5; 29/574

[56] References Cited

U.S. PATENT DOCUMENTS 4,476,512 10/1984 Sunago et al. ............ 219/121 LZ X
4,504,727 3/1985 Melcher et al. .............. 219/121 LB

FOREIGN PATENT DOCUMENTS 0098620 6/1982 Japan ............................ 219/121 LB
0144122 8/1984 Japan ............................ 148/DIG. 4
0037122 2/1985 Japan ............................ 148/DIG. 4

OTHER PUBLICATIONS

K. Jain, Controlled Laser Annealing by Raman Frequency Feedback, IBM Technical Disclosure Bulletin, vol. 24, No. 8, pp. 4026–4027, Jan. 1982.

Primary Examiner—C. L. Albritton
Attorney, Agent, or Firm—Hill, Van Santen, Steadman & Simpson

[57] ABSTRACT

An annealing method for heating a sample by applying radiation of light beams thereto, arranged so that the radiant power of the light beams is sampled or monitored by a light detector (a light detector 12, for example, formed of a phototransistor, photodiode, and the like) and the radiant power of the light beams is controlled through a feedback with the data derived from the monitoring used as the feedback control signal so that the heating temperature of the sample is stabilized. The annealing can be performed with excellent reproducibility from sample to sample.

5 Claims, 2 Drawing Sheets

ANNEALING METHOD BY IRRADIATION OF LIGHT BEAMS

BACKGROUND OF THE INVENTION

1. Field of the Invention

The present invention relates to an annealing method by irradiation with light beams which is suited for use in various heat treatments, such as in a process for manufacturing semiconductor devices. More particularly, the invention is useful when applied to a short-time annealing of a semiconductor substrate which has been injected with ions, as it is well-controlled and capable of reproducibly activating the injected impurities and thereby reproducibly forming a good impurity region.

2. Description of the Prior Art

Recently, a lamp annealing method has been put into practice as a heat treatment method in a manufacturing process for semiconductor devices. In this prior radiation annealing method, a material, or a sample, is heated by radiation with light beams from a lamp light source and the method has a feature that its use makes it possible to raise the temperature of the sample directly and quickly. In practicing this method, it has been desired that the sample be heat-insulated from the sample holder. Therefore, the sample holder is made of a material with low heat conductivity and, further, it is designed so that its sample holding area is as small as possible. In the measurement and control of the temperature of the sample, there have so far been two methods in use.

The first method is arranged as shown in FIG. 1, such that a sample 5 to be annealed (a semiconductor wafer, for example) and a sample as a temperature monitor 6 are mounted on sample holders 3, 4, respectively, which are disposed between lamp light sources 1, 2 connected to a specific power source (not shown). A thermocouple 7 is disposed in contact with the back side of the temperature monitor sample 6, and measurement of the temperature of the sample 5 is indirectly made by means of the output of the thermocouple 7, and control of the temperature of the sample 5 is made by feeding back the output of the thermocouple 7 to the power source of the lamp light sources 1, 2.

In the second method, the relationship between the temperature rising characteristic of the sample 5 and the power source voltage is obtained in advance and the temperature control of the sample 5 is made by applying the lamp light sources 1, 2 with specific voltage corresponding to a desired temperature.

However, there were some defects in the sample holding arrangement as shown in FIG. 1. That is, although it was designated that the holding area of the sample would become very small, the heat capacity of, and heat conduction in, the holding member are not negligibly small in a quickly heating and cooling temperature cycle. Accordingly, it was unavoidable that temperature differences were produced between various portions of the sample. As a result, when the above described method, whether the first method or the second method, was used, not only was uneven annealing conducted within the sample, but also, in the worst case, crystal defects resulting from thermal stress were produced. Specifically in the first method, there is a time lag as large as about 10 seconds between the output of the power source of the lamp light sources 1, 2 and that of the thermocouple 7, and therefore, in an annealing process that should be finished within 10 to 20 seconds, for example, practical temperature control could not be exercised satisfactorily.

Further, in the second method, since there was no feedback provided to the power source of the lamp light sources 1, 2, it was not possible to compensate for variations in the power source or deterioration in the lamps, and so, the method was defective in that annealing could not be reliably and precisely repeated.

On the other hand, a method of sample holding ensuring heat insulation between the sample and sample holder, is known in the form of gas flow suspension of the sample as shown in FIG. 2. In this method, a predetermined gas flow is introduced into a floating type sample holder 8 through one end and the gas is blown out from a number of orifices 8a provided in the holder whereby a sample 5 is made to be suspended by the gas under this condition, and the sample is annealed by a lamp light source (not shown). With this method, an improvement in the uniform temperature distribution within the sample may be achieved, but there is no other method for controlling the sample temperature than the previously described second method, and so, again, annealing cannot be conducted with satisfactory reproducibility. Further, the temperature rising and falling speeds cannot be freely regulated solely by the method of controlling the output of the power source of the lamp light source 1, 2, without monitoring the sample temperature.

OBJECT AND SUMMARY OF THE INVENTION

In view of the above described problems, an object of the present invention is to provide an annealing apparatus utilizing irradiation by light beams, in which the above described defects with the prior art light beam radiation annealing apparatus will be overcome.

Another object of the invention is to perform uniform annealing with excellent reproducibility.

A further object of the invention is to provide an annealing method with good temperature controllability even in a short-time annealing process.

Yet another object of the invention is to perform annealing with satisfactory reproducibility unaffected by variations in the heat source.

A still further object of the invention is to enable good annealing without restricting sample holding means.

According to the invention, in a light beam radiation annealing method for heating a sample by irradiation with light beams, the quantity of radiated light beams is monitored by a light detector (a light detector 12, for example, formed of a phototransistor, photodiode, and the like). Based upon data derived from the monitoring, the radiant power of the light beams is controlled by means of a feedback, whereby the heating temperature of the sample is stabilized and the annealing is conducted with good reproducibility.

DESCRIPTION OF THE PREFERRED EMBODIMENTS

Figure 1:
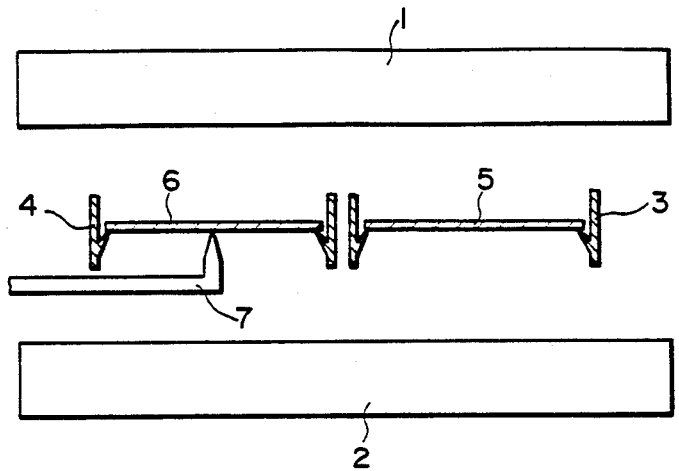
FIG. 1 is a block schematic diagram of a prior art lamp annealing furnace.
Figure 2:
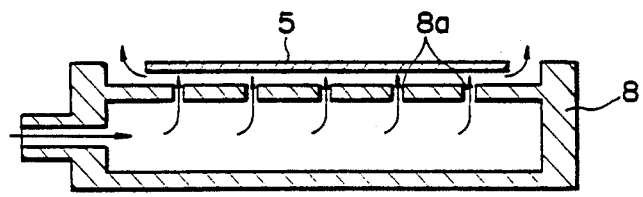
FIG. 2 is a cross-sectional view showing a prior art floating type sample holder.
Figure 3:
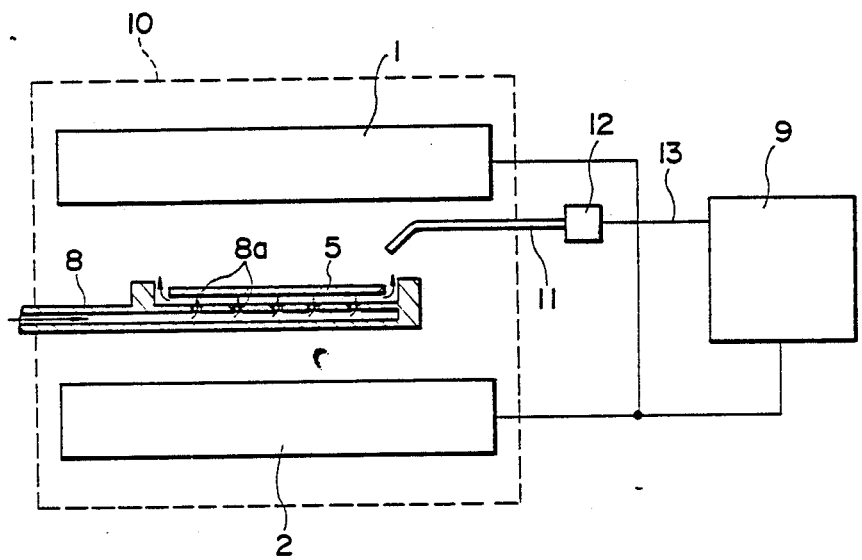
FIG. 3 is a block schematic diagram of an annealing apparatus utilizing irradiation by light beams, of an embodiment of the present invention.

A preferred embodiment of the invention will be described in the following with reference to FIG. 3. In FIG. 3, like parts to those in FIGS. 1 and 2 are denoted by like reference numerals and description of the same is omitted according to circumstances.

In a light beam radiation annealing apparatus of the embodiment shown in FIG. 3, there is incorporated with the apparatus a floating type sample holder 8 formed of quartz, for example, disposed between lamp light sources 1, 2 of infrared lamps connected with a power source 9. In the light beam radiation annealing apparatus, there is provided a fiber scope 11 made of glass fibers with one end thereof located inside the annealing furnace 10 and the other end thereof located outside of furnace 10. The other end of the fiber scope 11 is connected with a light detector 12 formed of a conventional phototransistor, photodiode, and the like.

In the present embodiment, the sample 5 is heated by infrared lamp light beams radiated from the light sources 1, 2 and a portion of the light beams inside the annealing furnace 10 enters one end of the fiber scope 11. The infrared lamp light beams may be allowed to enter the end of the fiber scope 11 directly from the light source or indirectly after being reflected by the sample. The light is transmitted through the fiber scope 11 and, after leaving the same from the other end, is detected by the light detector 12 and transmitted as an electrical signal. This output electrical signal is fed back through the feedback path 13 to the power source 9.

More specifically, the output of the power source 9 is lowered if the quantity of the light inside the annealing furnace 10 is larger than a predetermined value and the output of the power source 9 is raised if the quantity of the light is smaller than a predetermined value.

According to the above mentioned embodiment, since the quantity of light within the annealing furnace 10 is detected by the light detector 12, being transmitted through the fiber scope 11, and the electrical signal output from the light detector 12 is fed back to the power source 9 of the lamp light sources 1, 2, it is possible to stabilize the output of the light (radiant power) of the lamp light sources 1, 2, and hence, to assure the reproducibility of the annealing operation. Further, by obtaining the relationship between the output of the light of the lamp light sources 1, 2 and the temperature of the sample 5 in advance, the sample temperature can be controlled. Besides, by varying the output of the light of the lamp light sources 1, 2 with time, even the temperature rising and falling speeds of the sample 5 can be controlled.

Although one embodiment of the invention has been described in the foregoing, the present invention is not to be limited to the described embodiment, but various variations may be made based on the technical spirit of the present invention. For example, the way to sample the light within the annealing furnace 10 is not limited to the way as used in the above described embodiment, but the floating type sample holder 8 of quartz itself, for example, may be used as a light guide instead of the fiber scope 11, or the light detector 12 may be adapted to detect light entering therein directly, not through the fiber scope 11.

Although a floating type sample holder 8 has been used in the above described embodiment, the sample holding way as shown in FIG. 1 may be used according to the need. Further, while the case was taken up in the above descirbed embodiment, providing an annealing apparatus using lamp light sources 1, 2 of infrared lamps as its light irradiation means, the invention can also be applied to an annealing apparatus using a carbon heater or the like as its heater irradiation means.

We claim as our invention:

1. An annealing method employing irradiation by light beams comprising the steps of:
   applying radiation of light beams to a material from a light source;
   detecting a portion of said light beam of the same frequency spectrum as applied from said light source and transducing said portion into an electrical signal; and
   controlling radiant power of said light beams by said electrical signal as a feedback control signal in a feedback loop including said radiant power and said electrical signal.

2. The method of claim 1 wherein the detection step comprises detecting light at least in part as reflection from said material.

3. The method of claim 1 wherein said material is suspended in said light beams on a layer of moving gas.

4. The method of claim 1 wherein the detection step comprises detecting light beams directly from the source.

5. The method of claim 1 wherein the detection step comprises detecting light at least in part as radiation from said material.

* * * * *